(12) United States Patent
Wu

(10) Patent No.: US 12,166,488 B2
(45) Date of Patent: Dec. 10, 2024

(54) VOLTAGE MULTIPLIER SYSTEM

(71) Applicant: Valeo Automotive Air Conditioning Hubei Co Ltd, Hubei (CN)

(72) Inventor: Qiaozheng Wu, Hubei (CN)

(73) Assignee: VALEO AUTOMOTIVE AIR CONDITIONING HUBEI CO., LTD., Hubei (CN)

( * ) Notice: Subject to any disclaimer, the term of this patent is extended or adjusted under 35 U.S.C. 154(b) by 0 days.

(21) Appl. No.: 17/797,653

(22) PCT Filed: Apr. 7, 2021

(86) PCT No.: PCT/CN2021/085825
§ 371 (c)(1),
(2) Date: Aug. 4, 2022

(87) PCT Pub. No.: WO2021/155870
PCT Pub. Date: Aug. 12, 2021

(65) Prior Publication Data
US 2023/0082730 A1   Mar. 16, 2023

(30) Foreign Application Priority Data

Feb. 7, 2020   (CN) .......................... 202010082623.3

(51) Int. Cl.
*H03K 3/354* (2006.01)
*H03K 3/282* (2006.01)

(52) U.S. Cl.
CPC ............. *H03K 3/354* (2013.01); *H03K 3/282* (2013.01)

(58) Field of Classification Search
CPC ........ H03K 3/354; H03K 3/353; H03K 3/282; H03K 3/281
See application file for complete search history.

(56) References Cited

U.S. PATENT DOCUMENTS

| 3,354,350 A | 11/1967 | Kappenhagen et al. |
| 3,908,667 A | 9/1975 | Bernstein |

(Continued)

FOREIGN PATENT DOCUMENTS

| CN | 201209926 Y | 3/2009 |
| CN | 202003253 U | 10/2011 |

(Continued)

OTHER PUBLICATIONS

China National Intellectual Property Administration (CNIPA), The First Office Action (with English translation) of corresponding Chinese Application No. 202010082623.3, dated Dec. 3, 2021.

(Continued)

*Primary Examiner* — Adolf D Berhane
(74) *Attorney, Agent, or Firm* — VALEO AUTOMOTIVE AIR CONDITIONING HUBEI CO., LTD.

(57) ABSTRACT

The present invention provides a voltage multiplier system for an electrical device. The system includes a multi-vibrator adapted to generate a clock signal, and a voltage-multiplier module. Further, the multi-vibrator includes a pair of transistors, and at least one resistor-capacitor module. Further, the at least one resistor-capacitor module is connected between the emitter terminal and a base terminal of each of the pair of transistors to limit voltage between the base terminal and the emitter terminal of each of the pair of transistors. The voltage-multiplier module is adapted to boost an input voltage based on the clock signal received from the multi-vibrator.

9 Claims, 7 Drawing Sheets

(56) References Cited

U.S. PATENT DOCUMENTS

| | | | | |
|---|---|---|---|---|
| 6,100,665 | A * | 8/2000 | Alderman | H01M 10/465 |
| | | | | 320/127 |
| 6,307,350 | B1 * | 10/2001 | Alderman | H01M 10/46 |
| | | | | 320/116 |
| 9,983,880 | B2 | 5/2018 | Gonzalez-Alberquilla | |
| 2008/0007887 | A1 * | 1/2008 | Weaver | F41H 13/0018 |
| | | | | 361/232 |
| 2011/0304310 | A1 | 12/2011 | Sotono | |
| 2013/0175942 | A1 * | 7/2013 | Mainguet | G05F 1/46 |
| | | | | 307/31 |

FOREIGN PATENT DOCUMENTS

| | | | |
|---|---|---|---|
| CN | 102281048 | A | 12/2011 |
| CN | 206727900 | U | 12/2017 |
| CN | 110212756 | A | 9/2019 |
| GB | 1148221 | A | 4/1969 |
| JP | S5144857 | A | 4/1976 |
| JP | 2991706 | B1 | 12/1999 |
| JP | 2000092893 | A | 3/2000 |

OTHER PUBLICATIONS

National Intellectual Property Administration, PRC, International Search Report and Written Opinion of corresponding International Application No. PCT/CN2021/085825, dated Jul. 15, 2021.
European Patent Office, extended European search report of corresponding European Application No. 21750888.6, dated Jan. 22, 2024.

* cited by examiner

VOLTAGE MULTIPLIER SYSTEM

CROSS-REFERENCE TO RELATED APPLICATIONS

This application is filed under 35 U.S.C. § 371 U.S. National Phase of International Application No. PCT/CN2021/0085825 filed Apr. 7, 2021 (published as WO2021155870), which claims priority benefit to Chinese application No. 202010082623.3 filed on Feb. 7, 2020, the disclosures of which are herein incorporated by reference in their entirety.

TECHNICAL FIELD

The present invention generally relates to a voltage multiplier system, more particularly, to a voltage multiplier system connected between a battery and an electrical device when the polarity of the battery is reversely connected to the device.

BACKGROUND OF THE INVENTION

Generally, devices such as electrical heater or other electrical devices are connected to a battery pack through a switching device, in order to have a controlled environment. The switching device can be MOSFET, which requires a gate voltage to turn on. Generally, positive and negative terminals of the battery pack are connected to positive and negative terminals of the heater respectively. The switching device is connected between both negative terminals of the battery pack and the electrical heater. Further, the source terminal of the switching device can be connected to the negative terminal of the battery pack, whereas the drain terminal of the switching device is connected to the negative terminal of the heater. When the polarity of the battery is connected properly with the heater, i.e. as described above, the switching device is turned on, since the voltage across the gate and source is enough to short the source and drain terminals of the switching device. Therefore, the electrical heater is controlled by controlling voltage provided to the gate terminal of the switching device when the battery pack and the electrical heater are normally connected.

In case the polarity of the battery pack is reversed with respect to the electrical heater, the switching device may not turn on, since the voltage at the source terminal is the same as the gate voltage, thereby the voltage between the gate and the source terminals is zero. In such cases, the source terminal is connected to the positive terminal of the battery pack, so the voltage at the source terminal is less than or equal to the voltage at the gate terminal of the switching device. Therefore, the voltage across the gate and the source terminal is below the threshold voltage that is required to turn on the switching device. Hence, the switching device cannot be controlled properly due to voltage between the gate and the source terminal is zero (or at least very low), thereby there is a risk of failure occurring on the switching device, which is an issue in terms of safety. As the switching device is inefficient or inoperable when the battery pack is reversely connected to the electrical heater or any other electrical device, overall safety of system is compromised Accordingly, there is a need for a system to maintain a switching device in a conductive state irrespective of the way in which the polarities of a battery pack is connected to any electrical device through the switching device. Further, there is another need for a system that increases input voltage to maintain a switching device in an operative state when the switching device is connected between positive terminals of a battery pack and an electrical device. Further, there is another need for a protection system that controls the electrical device.

BRIEF SUMMARY OF THE INVENTION

An object of the present invention is to provide a voltage multiplier system that increases a voltage received at a switching device connected to an electrical device.

Another object of the present invention is to provide an electrical device, comprising a voltage multiplier system that increases the voltage.

Yet another object of the present invention is to provide the electrical device having a power modulation switch for modulating voltage.

Another object of the present invention is to provide a voltage multiplier system configured to increase the gate voltage of a switching device.

In view of the foregoing, an embodiment of the invention herein provides a voltage multiplier system for an electrical device. The system includes an multi-vibrator adapted to generate a clock signal, and a voltage-multiplier module. Further, the multi-vibrator includes a pair of transistors, and at least one resistor-capacitor module. Further, at least one resistor-capacitor module is connected to each of the pair of transistors to limit voltage between the base terminal and the emitter terminal of each of the pair of transistors. The voltage-multiplier module is adapted to boost an input voltage based on the clock signal received from the multi-vibrator.

In one embodiment, the multi-vibrator further includes a diode that is connected to an emitter terminal of each of the pair of transistors and ground. In another embodiment, the voltage-multiplier module is a charge pump having a push-pull amplifier adapted to double the input voltage.

Further, the system comprising a peak detector connected to an output of the charge pump to determine peak voltage generated in the charge pump.

Further, the least one resistor-capacitor module is connected parallel to the emitter terminal and a base terminal of each of the pair of transistors.

In one embodiment, the capacitor in the resistor-capacitor module charges, while corresponding transistor of the multi-vibrator is in a conducting state.

In another embodiment, the at least one resistor-capacitor module comprises a resistor and a capacitor connected in parallel to the resistor. Further, the capacitor is adapted to charge when the corresponding transistor is in a conductive state, and the resistor is adapted to dissipate the charge stored in the capacitor.

In yet another embodiment, the charge-pump comprises a long tailed pair transistor adapted to boost the input voltage based on the clock signal received from the multi-vibrator. In another aspect of the invention, an electrical device with a voltage multiplier system is provided to increase the voltage.

BRIEF DESCRIPTION OF THE DRAWINGS

Other characteristics, details and advantages of the invention can be inferred from the description of the invention hereunder. A more complete appreciation of the invention and many of the attendant advantages thereof will be readily obtained as the same becomes better understood by reference to the following detailed description when considered in connection with the accompanying figures, wherein.

It must be noted that the figures disclose the invention in a detailed enough way to be implemented, the figures helping to better define the invention if needs be. The invention should however not be limited to the embodiment disclosed in the description.

DETAILED DESCRIPTION OF THE INVENTION

The present invention relates to a voltage multiplier system for a power source, when the polarity of the power source is reversely connected to any electrical device through a switching device. Generally, the switching device can be MOSFET connected between the power source and the electrical device to control the electrical device. In one embodiment, the power source can be battery pack. In case the polarities of the power source are reversely connected to the electrical device and the switching device is connected between the positive terminal of the power source and the electrical device, the switching device may not turn on, due to zero voltage across gate and source terminals of the switching device. Hence, it is not possible to control the electrical device when the polarities of the power source are reversely connected to the electrical device. To avoid such scenario, a voltage multiplier circuit/system is added. The voltage multiplier system is configured to increase the gate voltage of the switching device. The voltage multiplier system can boost the voltage to a level required to maintain the switching device in a conductive state. Hence, the switching device is maintained in conductive state when the gate voltage is applied to the gate of the switching device. Thereby, the power source can power the electrical device. Further, the electrical device can be de-energized by removing gate voltage to the switching device.

Figure 1:
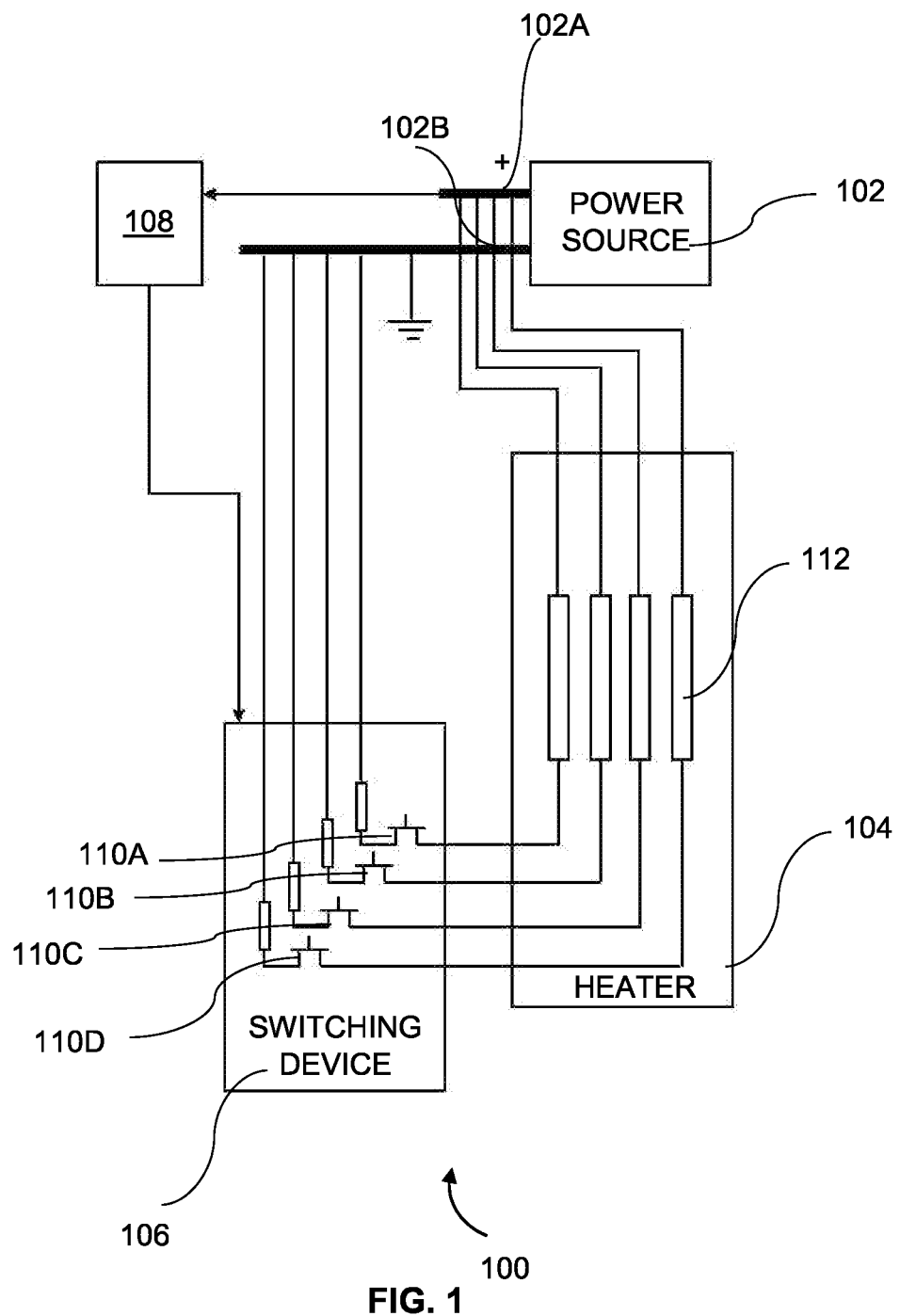
FIG. 1 illustrates a block diagram of an electrical system having a power source powering an electrical device through a switching device and a voltage multiplier system, in accordance with an embodiment of the present invention.

FIG. 1 illustrates a block diagram of an electrical system 100 having a power source 102 powering an electrical device 104 through a switching device 106. In this embodiment, the electrical device 104 is an electrical heater used in automobiles. The switching device 106 can include MOSFETs 110A-D (Metal Oxide Semi-conductor Field Effect Transistor) to control the heater. The electrical device 104 can include heating elements 112 connected between a first terminal 102A of the power source and drain terminals of the MOSFETs 110A-D. Further, source terminals of the MOSFETs 110A-D are connected to a second terminal 102B of the power source. When the battery is properly connected, the first terminal 102A is a positive terminal and the second terminal 102B is a negative terminal/ground terminal of the power source 102. In such case, voltage across the gate and the source terminals of the MOSFETs 110A-D is sufficient to turn on the switching device. When the battery is reversely connected, the voltage across the gate and the source terminals of the MOSFETs 110A-D is less than a threshold voltage required to turn on the MOSFETs 110A-D. Therefore, the power source 102 cannot energize the electrical device 104 when the polarities of the power source 102 is reversely connected to the electrical device 104. To overcome such problems, a voltage multiplier system/circuit 108 is connected between the switching device 106 and the first terminal 102A of the power source 102. The voltage multiplier system 108 can boost the input voltage received from the power source 102, to a level more than that of the threshold voltage, so that the switching device 106 can turn on and energize the electrical device 104. Further, the voltage multiplier system 108 is clearly explained in the forthcoming figures. Although, the voltage multiplier system 108 is explained with the electrical device 104 in form of a heater, it can be applied to any electrical devices.

Figure 2A:
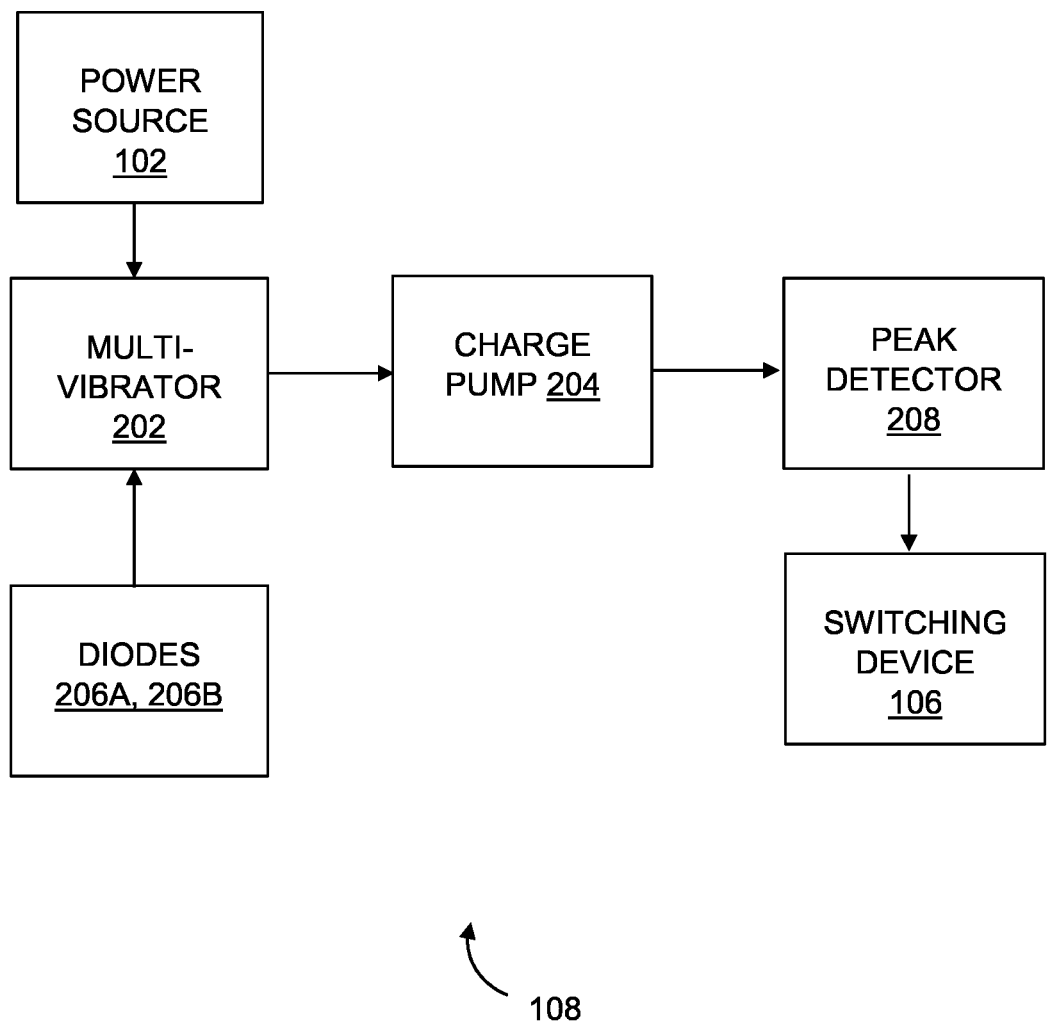
FIG. 2A illustrates a block diagram of a voltage multiplier system of FIG. 1, in accordance with an embodiment of the present invention.
Figure 2B:
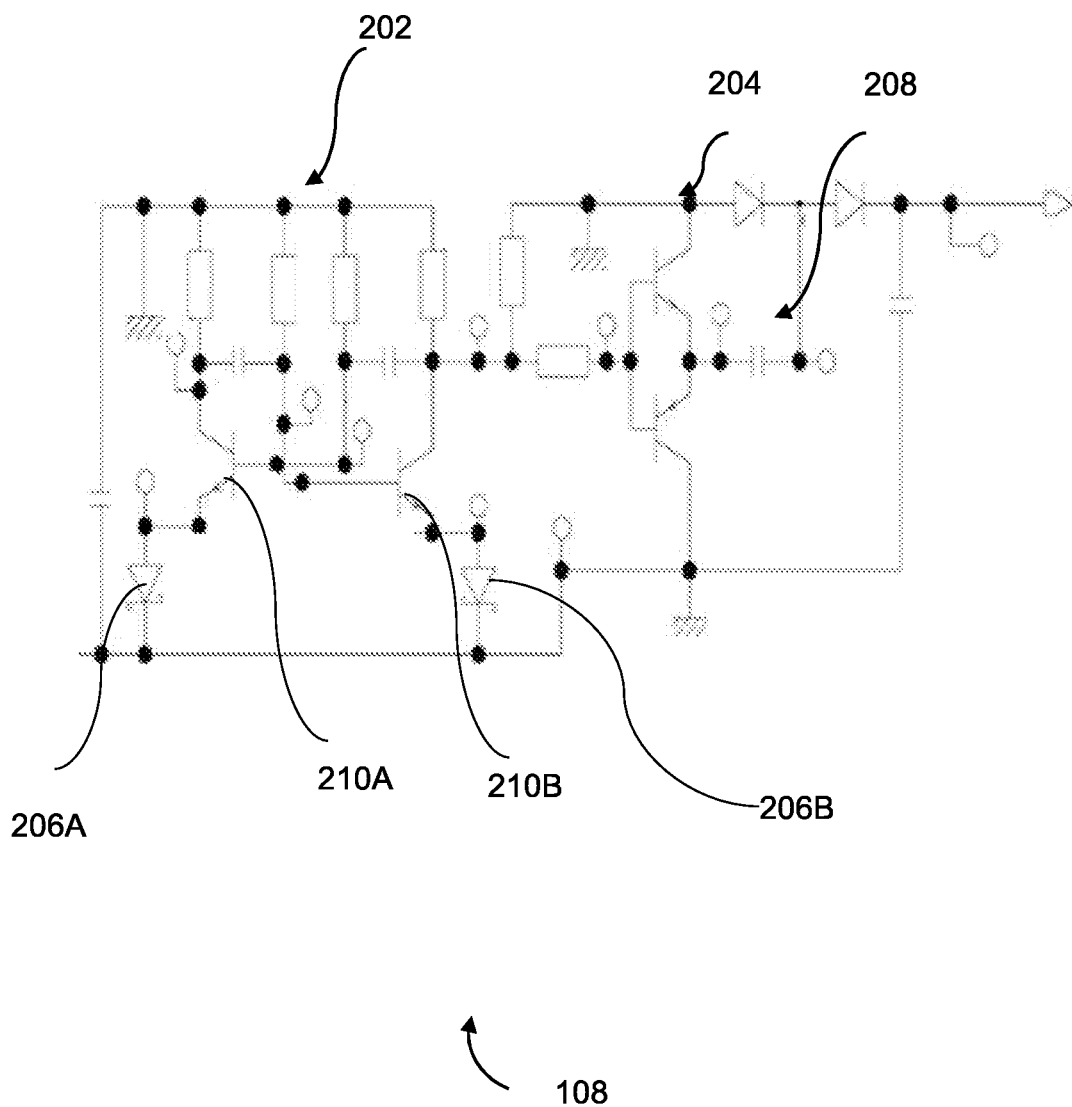
FIG. 2B is circuit diagram of the voltage multiplier system of FIG. 2A.

FIGS. 2A and 2B illustrate block and circuit diagrams of the voltage multiplier system 108 of FIG. 1, in accordance with an embodiment of the present invention. In one example, FIG. 2A illustrates a block diagram of the voltage multiplier system 108, and FIG. 2B is circuit diagram of the voltage multiplier system 108. Further, the voltage multiplier system 108 is adapted to boost the voltage for the gate of the switching device 106, in order to attain optimum voltage between the gate and source of the switching device 106, which is required to turn the switching device 106 into a conductive state. In one embodiment, the voltage multiplier system 108 can double the voltage for the gate of the switching device 106. In another embodiment, the voltage multiplier system 108 can increase the voltage to a level, which is equal to the normal value of the voltage for the gate, when the battery is properly connected, multiplied by a factor comprised between 1, 8 and 2, 2, preferably comprised between 1, 9 and 2, 1. The voltage multiplier system 108 includes a multi-vibrator 202 and a voltage multiplier module 204, preferably a charge pump, electrically coupled to the multi-vibrator 202. In one embodiment, the multi-vibrator 202 is an astable multi-vibrator generating pulse width modulation (PWM) signals for the voltage multiplier module 204. Further, a pair of diodes 206A, 206B is connected to the multi-vibrator to reduce voltage across a pair of transistors 210A, 210B of the multi-vibrator 202. In one example, at least one diode 206A is connected between the drain terminal of each of the transistor 210A, 210B and the ground. In one embodiment, each of the pair of diodes 206A, 206B is a zener diode. Further, the transistors 210A, 210B generate clock signals that are provided to the voltage multiplier module 204. The voltage multiplier module 204 is kind of amplifier that boost the input signal provided to the gate of the switching device 106. Although, the pair of diodes 206A, 206B reduce the voltage across the pair of transistors 210A, 210B, still the voltage across the base and the emitter terminals of the pair of transistors 210A, 210B is big enough to damage the transistors 210A, 210B. In this example, the pair of transistors 210A, 210B can withstand a maximum voltage of 5V across the base and the emitter terminals, but the voltage across the base and the emitter terminals is approximately 8.5V, which is greater than the threshold voltage of 5V. Hence, the transistors 210A, 210B can be damaged. To overcome this, a resistor and a capacitor is connected between the base and the emitter terminals of each of the pair of transistors 210A, 210B. Further, it is clearly explained in the forthcoming figures in this document.

Figure 3A:
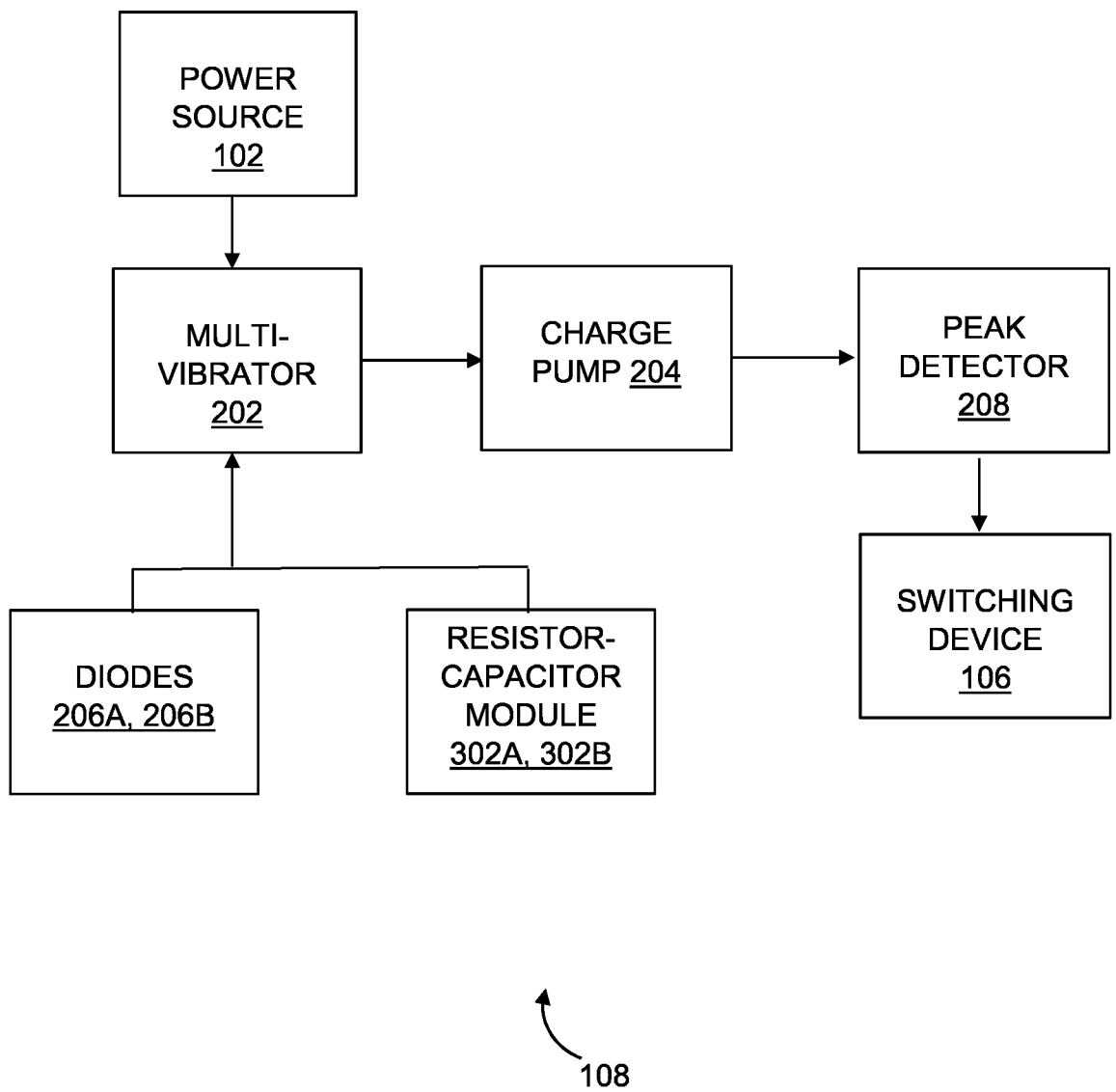
FIGS. 3A and 3B illustrate a block diagram and a circuit schematic of the voltage multiplier system provided with a pair of resistor-capacitor modules of FIG. 1, in accordance with another embodiment of the present invention.
Figure 3B:
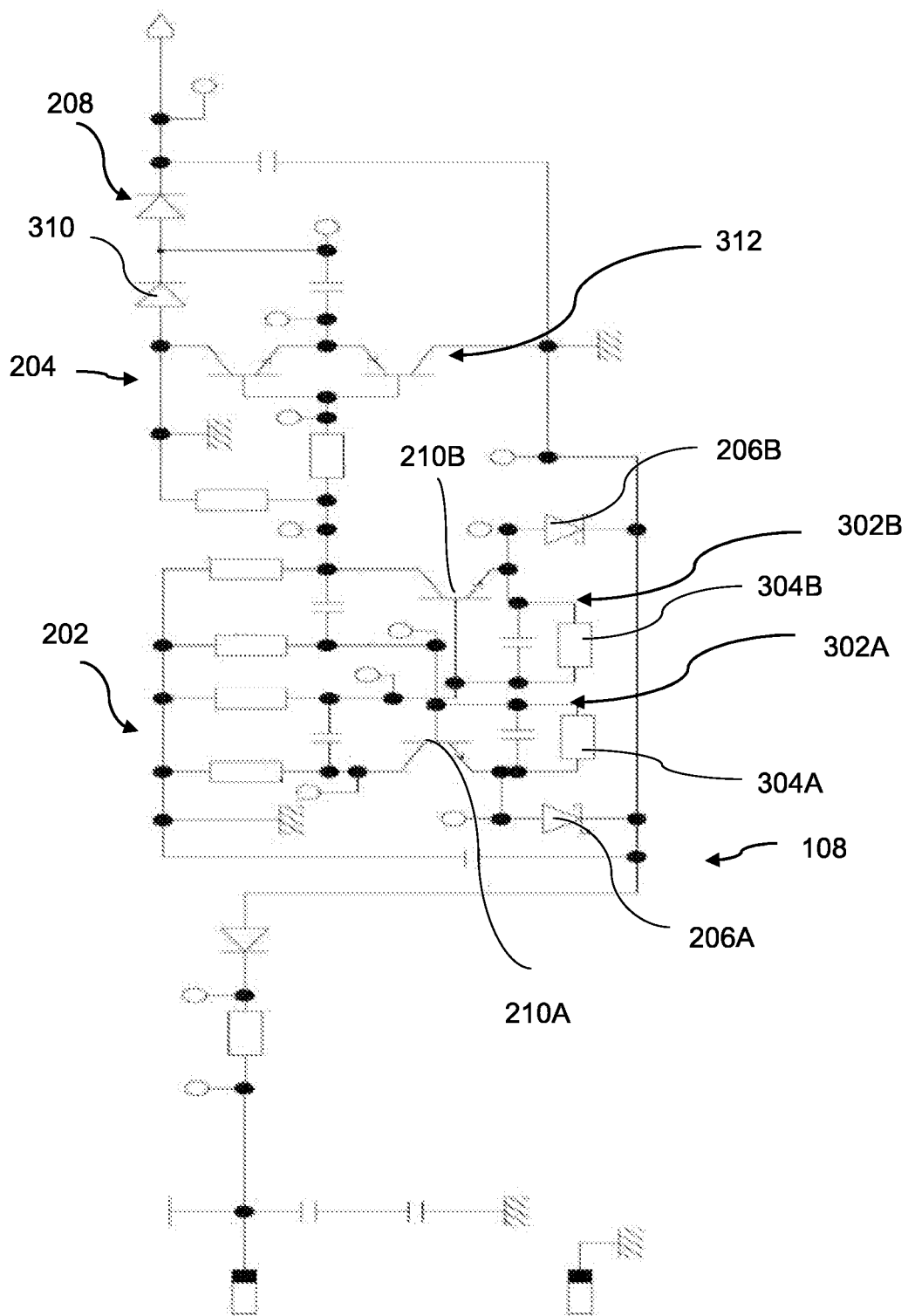

FIGS. 3A and 3B illustrate a block diagram and a circuit schematic of the voltage multiplier system 108 provided with a pair of resistor-capacitor modules 302A, 302B, in accordance with another embodiment of the present invention. As explained before, the voltage multiplier system 108 includes the multi-vibrator 202, in particular astable multi-vibrator, provided with the pair of transistors 210A, 210B, and the voltage multiplier module 204 connected to the pair of transistors 210A, 210B. Further, the pair of diodes 206A, 206B is connected to the multi-vibrator to reduce voltage across the pair of transistors 210A, 210B of the multi-vibrator 202. In one example, at least one diode 206A is connected between the drain terminal of each of the transistors 210A, 210B and the ground. Further, at least one resistor-capacitor module 302A, 302B is connected between the drain and the base terminals of each of the pair of transistors 210A, 210B. In one embodiment, each of the pair of resistor-capacitor modules 302A, 302B includes a resistor 304A, 304B and a capacitor 306A, 306B connected in parallel to each other.

In this example, the pair of transistors 210A, 210B considered to as a first transistor 210A and a second transistor 210B are connected to the first terminal 102A of the power source 102 through resistors. Further, the pair of diodes 206A, 206B referred to as a first diode 206A and a second diode 206B, in this example. When the first transistor 210A is in a conducting state, the first diode 206A conducts the voltage, meanwhile the capacitor 306A charges to its full capacity. Further, the corresponding resistor 304A connected to the capacitor 306A discharges the voltage charged by the capacitor 306A. In other words, the resistor 304A dissipates the energy stored in the capacitor 306A. As the capacitor 306A charges during the first transistor 210A is in a conductive state, the voltage across the base and the emitter terminals of the first transistor 210A is reduced below the threshold voltage. Further, same operations are applied to the second transistor 210B, when it is in a conducting state. Further, the first transistor 210A and the second transistor 210B are alternatively in a conductive state and non-conductive state, thereby generating a clock signal at a frequency.

As explained above, when the first transistor 210A is in a conductive state, the second transistor 210B is in a non-conductive state and vice versa. Hence, the clock signal is generated at the output of the multi-vibrator 202. When the first transistor 210A is in a conductive state, the first diode 206A and the first capacitor 306A restrict the voltage across the base and the drain terminals of the first transistor 210A below the threshold voltage of the first transistor 210A, thereby avoiding damages to the first transistor 210A and generating clock signal. Further, when the second transistor 210B is in a conductive state, the second diode 206B and the second capacitor 306B restrict the voltage across the base and the emitter terminals of the second transistor 210B below the threshold voltage of the second transistor 210B, thereby avoiding damages to the second transistor 210B and generating clock signal. In this example, as shown in FIG. 3B, the threshold voltage of the pair of transistors 210A, 210B is 5V and the voltage across the base and the emitter terminals of the transistors 210A, 210B is 2.70V, which is less than that of the threshold voltage.

Further, the generated clock signal is provided to the voltage multiplier module 204 to boost the input voltage. The voltage multiplier module 204 can be a push-pull amplifier having a long tailed pair transistor 312 adapted to boost the input voltage based on the clock signal received from the multi-vibrator 202. In one embodiment, the long tailed pair transistor 312 is connected to the multi-vibrator 202. According to one embodiment, the long tailed pair transistor 312 is adapted to boost the voltage to double of its original input voltage. Further, the output of the voltage multiplier module 204 is connected to a peak detector 208 to determine peak voltage generated in the voltage multiplier module 204. In one embodiment, the voltage multiplier system 108 further includes a blocking diode 310 connected between the output of the voltage multiplier module 204 and the peak detector 208 to restrict reverse flow of voltage into the voltage multiplier module 204.

Figure 4A:
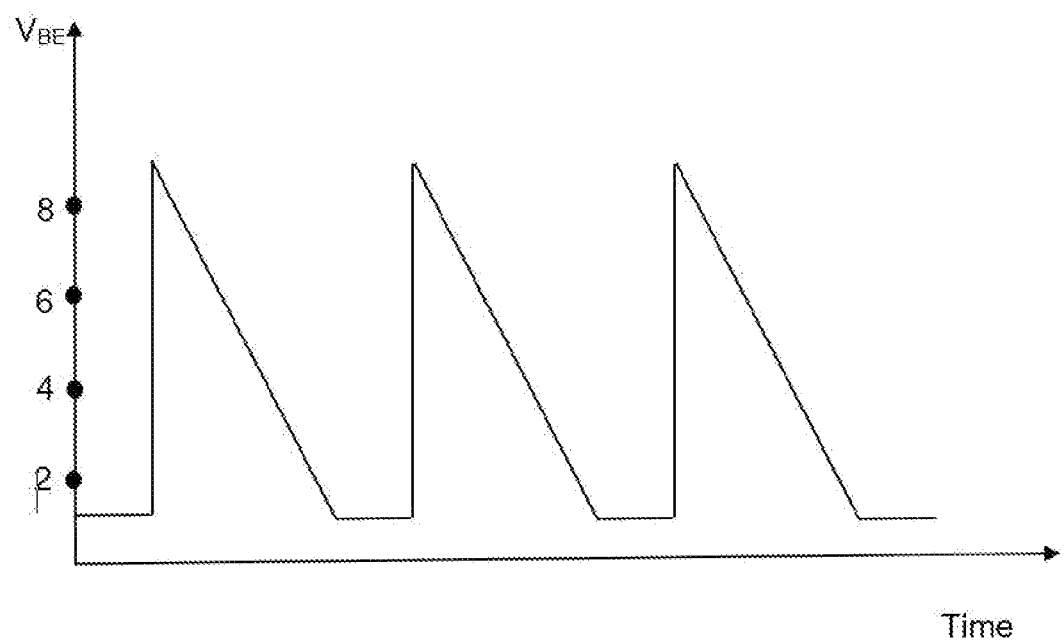
FIGS. 4A and 4B illustrate schematic representation of voltage across the base and emitter terminals of the pair of transistors, without and with the resistor-capacitor module respectively, of FIGS. 2A and 3A.
Figure 4B:
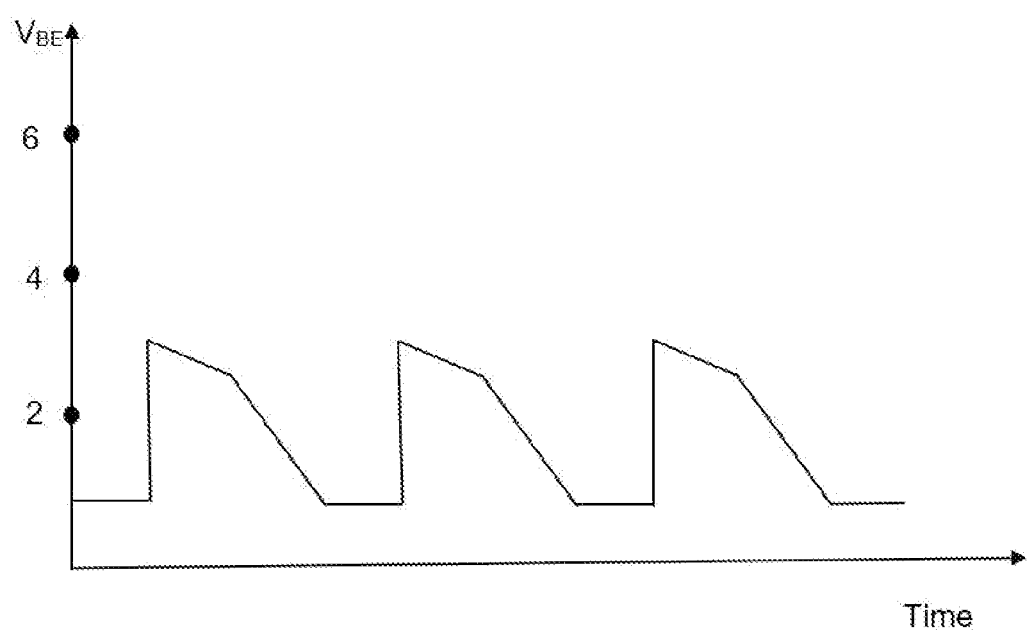

FIGS. 4A and 4B illustrate schematic representation of voltage across the base and the emitter terminals of the pair of transistors 210A, 210B, without and with the pair of resistor-capacitor modules 302A, 302B respectively, of FIGS. 2A and 3A. In one example, FIG. 4A is a waveform illustrating the maximum voltage across the base and the emitter terminals of the pair of transistors 210A, 210B, when no resistor-capacitor module 302A, 302B is connected to the pair of transistors 210A, 210B. It is evident from the waveform illustrated in FIG. 4A, that the maximum voltage across the base and the emitter terminals of the pair of transistors 210A, 210B is more than of the threshold voltage of the pair of transistors 210A, 210B. Therefore, the voltage across the base and the emitter terminals can damage the pair of transistors 210A, 210B. In this example, the threshold voltage of the pair of transistors 210A, 210B is 5V. Hence, the pair of resistor-capacitor modules 302A, 302B is connected between the base and the emitter terminals of each of the pair of transistors 210A, 210B to reduce the maximum voltage across the base and the emitter terminals of the pair of transistors 210A, 210B. FIG. 4B is a waveform illustrating the maximum voltage across the base and the emitter terminals of the pair of transistors 210A, 210B, when the pair of resistor-capacitor modules 302A, 302B is connected to the pair of transistors 210A, 210B. It is evident from FIG. 4B that the voltage across the base and the emitter terminals is reduced below the threshold voltage, when the pair of resistor-capacitor modules 302A, 302B is connected between the base and the emitter terminals of the pair of transistors 210A, 210B, thereby avoiding any damages to the pair of transistors 210A, 210B.

According to another aspect of the invention, the electrical device 104 can include the voltage multiplier system 108 as described above. According to another aspect, the electrical device 104 includes a switching device 106, also referred to as power modulation switch. In one aspect of the invention, the voltage multiplier system 108 is configured to increase the gate voltage of the switching device 106. In another aspect, the electrical device 104 is an electrical heater, in particular for a vehicle, in which heating power is controlled by the switching device 106.

Again referring to FIG. 1, the voltage boosted by the voltage multiplier module 204 is provided to the gate of the switching device 106. In this example, minimum voltage required to switch the MOSFET's 110A-D of the switching device 106 to a conductive state is 12V, and the input voltage from the power source is 12V. Therefore, the input voltage has to be doubled, i.e., to 24V, to maintain the switching device 106 in a conductive state. The voltage multiplier module 204 can double the input voltage of 12V into 24V based on the clock signal received from the multi-vibrator 202, thereby, the switching device 106 receives the 24V at the gate terminal of the MOSFETs 110A-D. Further, the gate voltage is applied to the gate terminal of the MOSFETs 110A-D, thereby, the switching device 106 is in a conductive state, even when the polarities of the power source 102 is reversely connected to the electrical device 104.

In any case, the invention cannot and should not be limited to the embodiments specifically described in this document, as other embodiments might exist. The invention shall spread to any equivalent means and any technically operating combination of means.

The invention claimed is:

1. A voltage multiplier system for an electrical device, comprising:
   a multi-vibrator adapted to generate a clock signal, wherein the multi-vibrator includes:
      a pair of transistors;
      at least one resistor-capacitor module that is connected to each of the pair of transistors to limit voltage between a base terminal and an emitter terminal of each of the pair of transistors; and
      a voltage-multiplier module adapted to boost an input voltage based on the clock signal received from the multi-vibrator,
   wherein the multi-vibrator includes a pair of diodes, with each of the pair of diodes connecting an emitter terminal of each of the pair of transistors to ground.

2. The voltage multiplier system as claimed in claim 1, wherein the voltage-multiplier module is a charge pump having a push-pull amplifier adapted to increase the input voltage.

3. The voltage multiplier system as claimed in claim 1, further comprising a peak detector connected to an output of the voltage-multiplier module to determine peak voltage generated in the voltage-multiplier module.

4. The voltage multiplier system as claimed in claim 1, wherein the at least one resistor-capacitor module is connected parallel to the emitter terminal and the base terminal of each of the pair of transistors.

5. The voltage multiplier system as claimed in claim 1, wherein the at least one resistor-capacitor module includes a resistor and a capacitor, with the capacitor connected in parallel to the resistor.

6. The voltage multiplier system as claimed in claim 5, wherein the capacitor is adapted to charge when a corresponding transistor of the multi-vibrator is in a conducting state.

7. The voltage multiplier system as claimed in claim 6, wherein the resistor in the at least one resistor-capacitor module is adapted to dissipate the charge stored in the capacitor.

8. The voltage multiplier system as claimed in claim 1, wherein the voltage-multiplier module includes a long tailed pair transistor adapted to boost the input voltage based on the clock signal received from the multi-vibrator.

9. An electrical device, comprising a voltage multiplier system for an electrical device, including:
   a multi-vibrator adapted to generate a clock signal, wherein the multi-vibrator includes:
      a pair of transistors;
      at least one resistor-capacitor module that is connected to each of the pair of transistors to limit voltage between a base terminal and an emitter terminal of each of the pair of transistors; and
   a voltage-multiplier module adapted to boost an input voltage based on the clock signal received from the multi-vibrator,
   wherein the multi-vibrator includes a pair of diodes, with each of the pair of diodes connecting an emitter terminal of each of the pair of transistors to ground.

\* \* \* \* \*